United States Patent [19]

Tsuboi

[11] Patent Number: 5,432,802
[45] Date of Patent: Jul. 11, 1995

[54] INFORMATION PROCESSING DEVICE HAVING ELECTRICALLY ERASABLE PROGRAMMABLE READ ONLY MEMORY WITH ERROR CHECK AND CORRECTION CIRCUIT

[75] Inventor: Toshihide Tsuboi, Tokyo, Japan

[73] Assignee: NEC Corporation, Japan

[21] Appl. No.: 123,693

[22] Filed: Sep. 17, 1993

Related U.S. Application Data

[63] Continuation of Ser. No. 660,787, Feb. 25, 1991, abandoned.

[30] Foreign Application Priority Data

Feb. 26, 1990 [JP] Japan ................................. 2-46084

[51] Int. Cl.6 .......................................... H03M 13/00
[52] U.S. Cl. .................................................. 371/40.1
[58] Field of Search .................. 371/40.1, 51.1, 2.2, 371/10.1, 21.1, 40.4, 3, 37.3, 40.2

[56] References Cited

U.S. PATENT DOCUMENTS

| | | | |
|---|---|---|---|
| 4,244,019 | 1/1981 | Anderson et al. | 364/200 |
| 4,612,640 | 9/1986 | Mehrotra et al. | 371/40.1 |
| 4,688,219 | 8/1987 | Takemae | 371/51.1 |
| 4,701,886 | 10/1987 | Sakakibara et al. | 371/21.1 |
| 4,768,193 | 8/1986 | Takemae | 371/51.1 |
| 4,817,095 | 3/1989 | Smelser et al. | 371/40.1 |
| 4,881,232 | 11/1989 | Sako et al. | 371/40.1 |
| 4,926,426 | 5/1990 | Scheuneman et al. | 371/40.1 |
| 4,950,352 | 9/1990 | Noguchi et al. | 371/40.1 |
| 5,005,165 | 4/1991 | Yamanaka et al. | 369/58 |
| 5,140,597 | 8/1992 | Araki | 371/51.1 |
| 5,142,541 | 8/1992 | Kim et al. | 371/51.1 |
| 5,233,614 | 8/1993 | Singh | 371/5.1 |

Primary Examiner—Robert W. Beausoliel, Jr.
Assistant Examiner—Phung My Chung
Attorney, Agent, or Firm—Laff, Whitesel, Conte & Saret, Ltd.

[57] ABSTRACT

An information processing device according to the present invention includes a logical circuit which outputs a signal for indicating that an error correction has been conducted on a data, when an error check and correction (ECC) circuit detects and corrects an error of data at the time of reading data from a memory cell array of an electrically erasable programmable ROM (EEPROM). In the information processing device of the present invention, while the EEPROM outputs the correct data by means of the ECC circuit, it can be known whether there exists an error even in a part of the cells in the EEPROM, so that it is possible to alter an address of a memory cell containing an erroneous bit in the EEPROM or to change the EEPROM itself before malfunction occurs in the information processing device having the EEPROM due to a breakdown of the memory cells in the EEPROM.

3 Claims, 5 Drawing Sheets

F I G .1
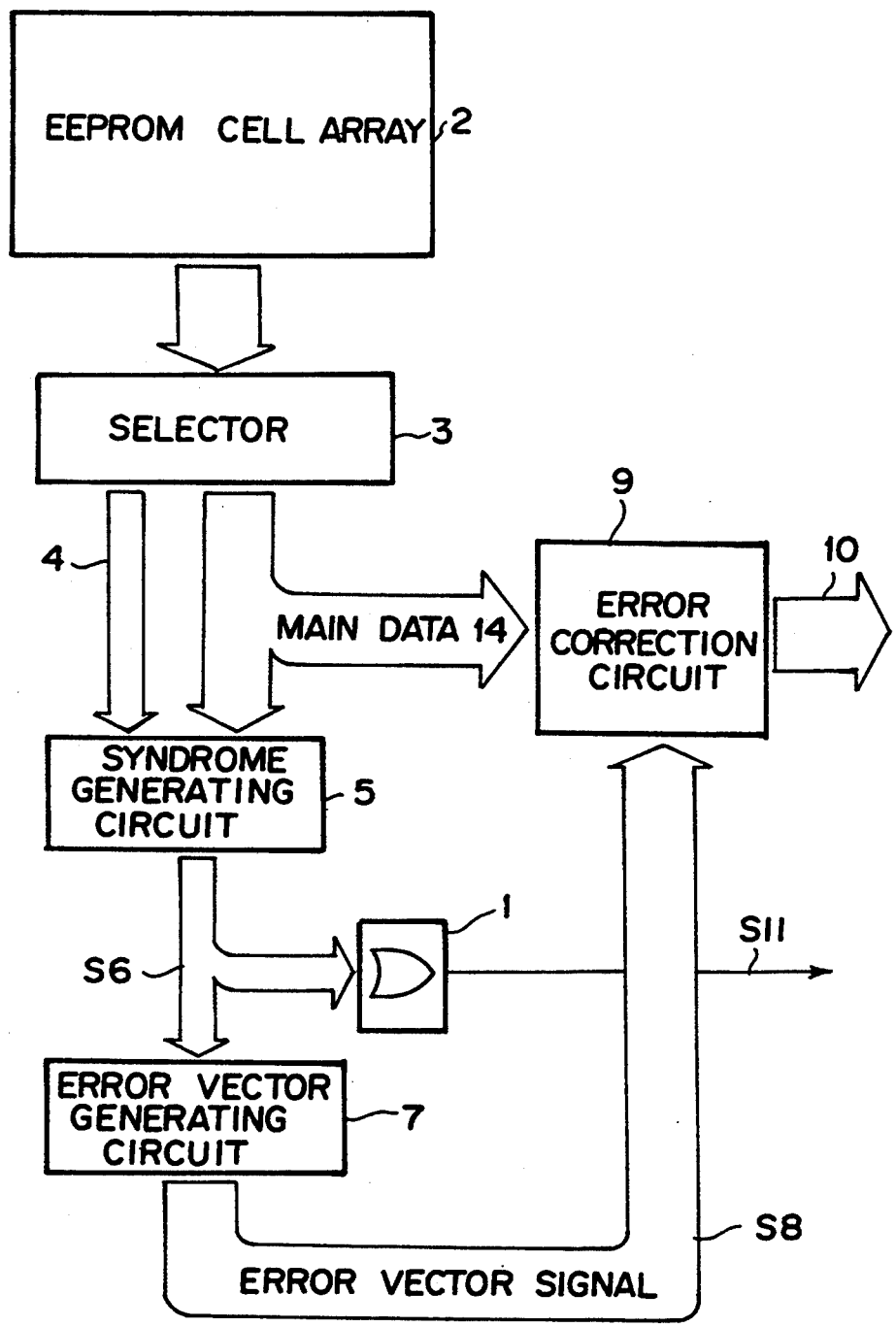

F I G. 7
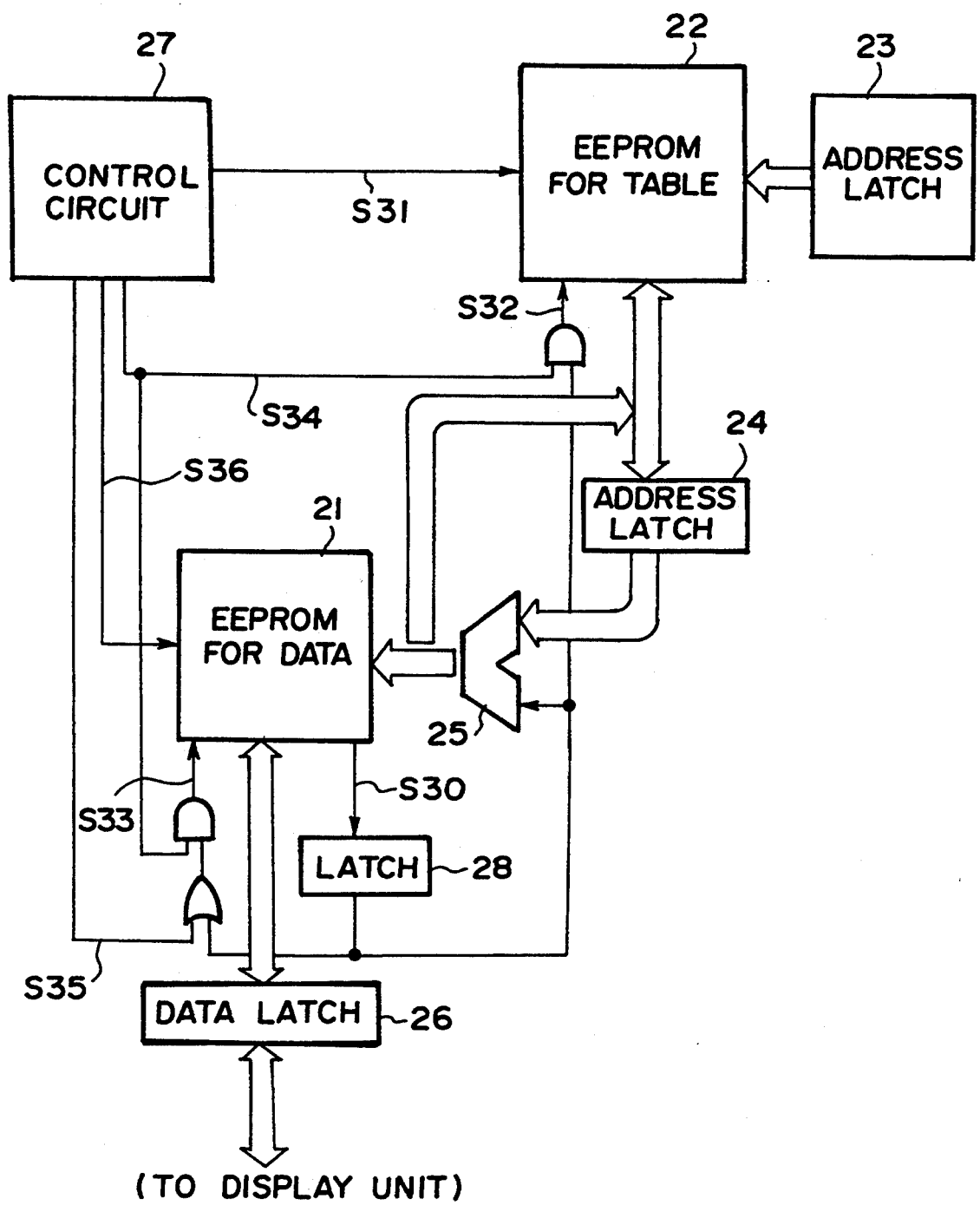
(TO DISPLAY UNIT)

INFORMATION PROCESSING DEVICE HAVING ELECTRICALLY ERASABLE PROGRAMMABLE READ ONLY MEMORY WITH ERROR CHECK AND CORRECTION CIRCUIT

This application is a continuation of application Ser. No. 07/660,787, filed Feb. 25, 1991, now abandoned.

BACKGROUND OF THE INVENTION

The present invention relates to an information processing device, in particular, an information processing device which has an electrically erasable programmable read only memory (hereinafter expressed by the acronym "EEPROM") with an error check and correction circuit (hereinafter referred to as "ECC circuit").

The EEPROM installed in an information processing device generally has the disadvantage that, in the course of a repetition of erasing and writing data, a memory cell in the EEPROM is destroyed and a data is lost. In order to cope with this, there has been developed an EEPROM having an ECC circuit. The ECC circuit treats a Hamming code which, for example, comprises data of 8 bits and redundant data of 4 bits added thereto. In this example, even if there is destruction of a memory cell corresponding to one of the 12 bits which is the sum of the data itself of 8 bits and redundant data of 4 bits, it is possible to restore or reconstitute the original data. Thus, the information processing device having such an ECC circuit enjoys high reliability.

However, even for the information processing device which includes the EEPROM having the ECC circuit mentioned above, it is impossible to restore the original data when there are more bits than those which can be corrected by the ECC circuit. In the case of a Hamming code which comprises data of 8 bits and additional redundant data of 4 bits, for example, it is impossible to recover the data when the memory cells corresponding to 2 bits out of the sum of 12 bits are destroyed.

The destruction of the memory bits gradually progresses through the repetition of erasing and writing of data.

In a conventional information processing device which includes the EEPROM having the ECC circuit, assuming that one bit of the memory cells is destroyed but the correct data is being obtained by the ECC circuit, it is impossible to detect the destruction of even a part of the memory cells, so that there is a fear that the destruction of the memory cells further progresses. Hence, the abnormality of the EEPROM cannot be known until the correct data therefrom becomes no longer obtainable. This results in a problem in that the abnormality causes malfunction of the whole information processing device. This problem is serious when there are a great number of repetitions of erasing and writing data.

SUMMARY OF THE INVENTION

It is, therefore, an object of the present invention to overcome the problems existing in the conventional arrangement and to provide an improved information processing device.

It is another object of the present invention to provide an information processing device in which, even though the correct data is being obtained by an ECC circuit, it can be known whether there exists a data destruction in the memory cells in an EEPROM.

It is a further object of the present invention to provide an information processing device in which it is possible to alter an address of a memory cell containing an erroneous bit in the EEPROM or to change the EEPROM itself before malfunction occurs in the information processing device having the EEPROM due to a breakdown of the EEPROM cells.

In carrying out the above and other objects of the present invention in one form, there is provided an improved information processing device comprising:
an array of EEPROM cells;
an error check and correction circuit which checks and corrects an error in bits forming a data read out from the array of EEPROM cells; and
a logical circuit which outputs a signal for indicating the execution of an error correction when the error check and correction circuit detects and corrects the error in the bits.

According to the present invention, more preferably, an information processing device comprises an array of EEPROM cells, an error check and correction circuit which checks and corrects an error in bits forming a data read out from the array of EEPROM cells, a logical circuit which outputs a signal for indicating the execution of an error correction when the error check and correction circuit detects and corrects the error in the bits, and an address altering means which alters an address storing the data in the array of EEPROM cells on the basis of the signal for indicating the execution of the error correction.

BRIEF DESCRIPTION OF THE DRAWINGS

The above and other objects, features and advantages of the present invention will be apparent from the following description of preferred embodiments according to the present invention explained with reference to the accompanying drawings, in which:

FIG. 1 shows a block diagram of an information processing device as a first embodiment according to the present invention;

FIG. 7 shows a block diagram of an information processing device as a second embodiment according to the present invention.

PREFERRED EMBODIMENTS OF THE INVENTION

Figure 2:
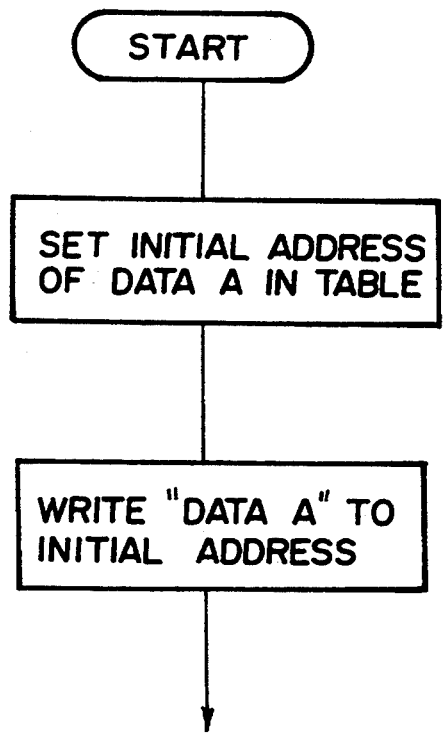
FIGS. 2 to 4 show flow charts explaining a software used for the information processing device of the first embodiment according to the present invention.

Embodiments of the present invention will be described in detail hereinafter with reference to the appended drawings.

FIG. 1 shows a block diagram of an information processing device as a first embodiment according to the present invention.

In this figure, there are shown a logical sum or OR circuit 1 which is essential in the present invention, an EEPROM cell array 2, a selector 3, a syndrome generating circuit 5, an error vector generating circuit 7 and an error correction circuit 9.

The operation of the first embodiment of the present invention will be explained hereinafter. In order to read data from the EEPROM 2, at first, the cells corresponding to an address to be read in the EEPROM cell array 2 are selected by the selector 3 and, then, main data 14 which has the same number of bits as the original data; and redundant data 4 are outputted. This outputted data is inputted to the syndrome generating circuit 5. The syndrome generating circuit 5 generates syndrome signals S6 based on the inputted main data 14 and redundant data 4. If all of the selected cells are in order and both the main data 14 and the redundant data 4 have no damage, all of the syndrome signals S6 become "0". The syndrome signals S6 are inputted to the error vector generating circuit 7 which decodes the syndrome signals S6 and produces an error vector signal S8. The error vector signal S8 shows which bit has an error in the main data 14 and the redundant data 4. When an error exists in the main data 14, the error correction circuit 9 corrects the error therein and outputs a corrected data 10. At the same time, the syndrome signals S6 are inputted to the logical sum circuit 1. If there exists any error in the main data 14 or the redundant data 4, at least one bit of the syndrome signals S6 becomes "1", so that an output signal of the logical sum circuit 1, namely, an error correction signal S11 (signal for indicating the execution of an error correction) becomes "1".

Figure 3:
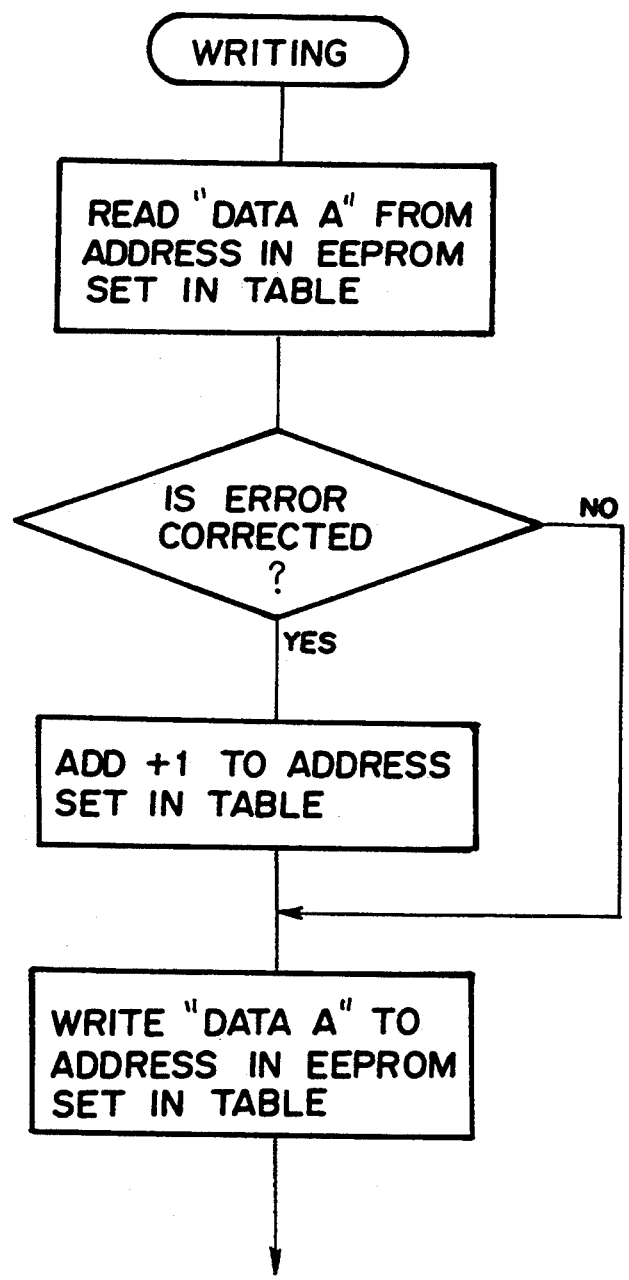
Figure 4:
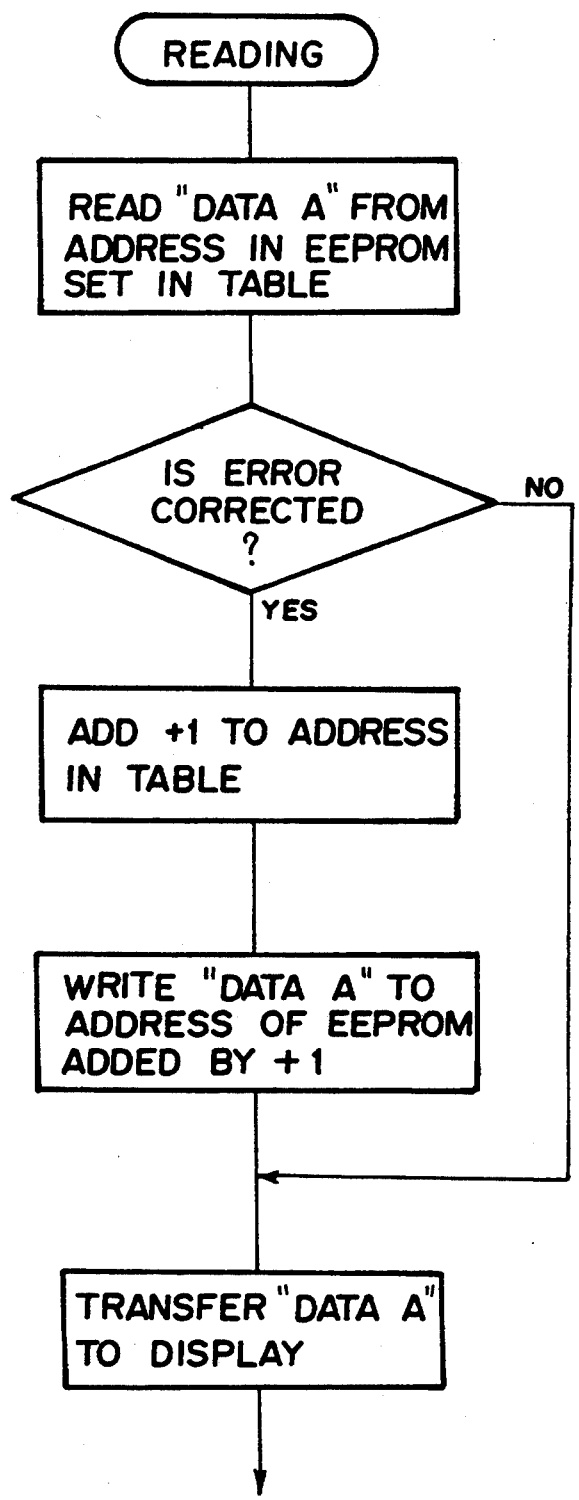
Figure 5:
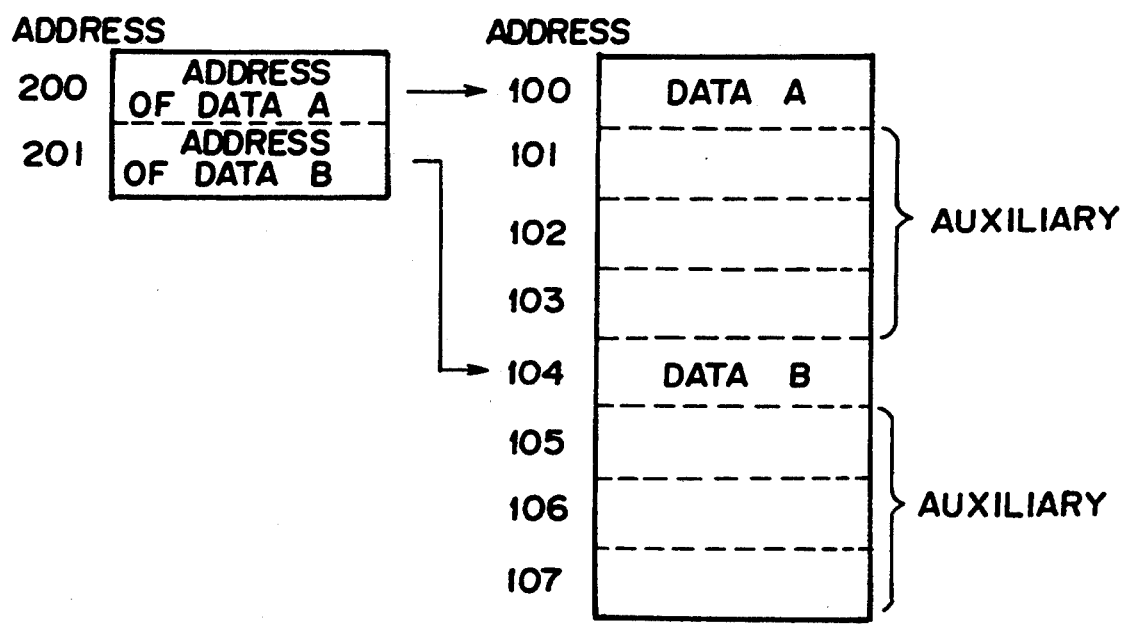
FIGS. 5 and 6 illustrate an example of memory mapping on the software explained in the flow charts shown in FIGS. 2 to 4.
Figure 6:
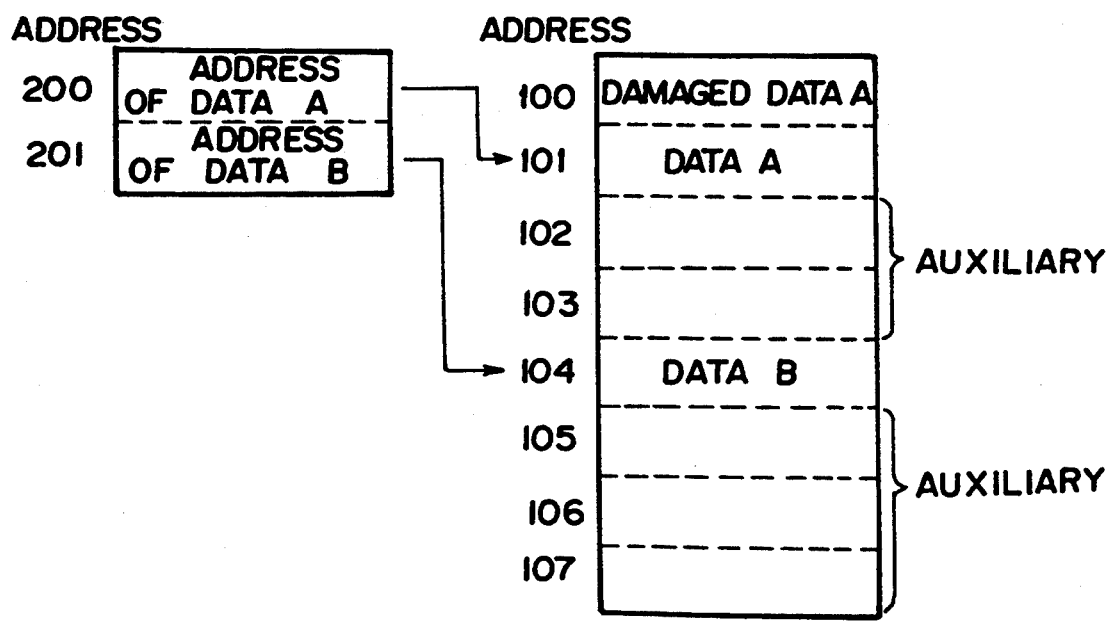

In the information processing device which has the EEPROM 2 of the first embodiment according to the present invention, even if a large number of times of the erasing and writing of data are repeated, it is possible to maintain high reliability in the following ways. FIGS. 2 to 4 show flow charts of a software used in the information processing device of the first embodiment. FIGS. 5 and 6 illustrate an example of memory mapping on the software explained in the flow charts.

Now, the operation at the start of using the device will be explained hereinafter with reference to the appended drawings on the premise that, at this time, the EEPROM 2 does not have damage and has data A and B with high reliability. At first, memory areas, including auxiliary areas, for the data A and B are secured in the EEPROM 2 as illustrated in FIG. 5. In an example illustrated in FIG. 5, an address 100 in the EEPROM 2 is an initial address for the data A, addresses 101–103 are auxiliary addresses for the data A while an address 104 is an initial address for the data B and addresses 105–107 are auxiliary addresses for the data B. A table which stores the addresses for the data A and B in the EEPROM 2 is also secured in the EEPROM 2. In the table shown in FIG. 5, the address 100 for the data A is stored in an address 200 and the address 104 for the data B is stored in an address 201.

The procedure for the start of using the information processing device as the first embodiment is illustrated in FIG. 2. At first, the initial address 100 for the data A is written in the address 200 of the table (step 701) and, then, the value of the data A is written in the address 100 of the EEPROM 2 (step 702). The similar process is conducted for the data B.

Next, the procedure for an execution of writing data will be described hereinafter with reference to FIG. 3.

FIG. 3 illustrates a flow chart of the procedure for the execution of writing data. In order to write the data A, the address which stores the data A is accessed by making reference to the address 200 of the table in the EEPROM 2 and the stored data A is read out from the address 100 in the EEPROM (step 801). Then, it is checked whether the error correction has been executed at the reading of the data A (step 802). If an error correction is detected, which means there does exist an error bit in the address 100, the address stored in the address 200 of the table is added by +1 (step 803). Subsequently, the corrected data A is written in the new address 101 which is now stored in the address 200 of the table (step 804).

According to the current technology, it is possible to rewrite data several hundred thousand times at the same address. Assuming that the address value 100 for the data A is stored in the address 200 of the table, rewriting at the address 100 of the EEPROM 2 is conducted several hundred thousand times and, then, if one bit therein is erroneous, the above procedure for writing data may be applied in the following way.

At first, the address 200 of the table in the EEPROM 2 is read and, then, the address value 100 for the data A is read. Then, the value of data A stored in the address 100 is read out. In the case where one bit in the address 100 is erroneous, an error correction signal S11 for indicating the execution of an error correction is outputted, so that the address value stored in the address 200 of the table is added by +1 and accordingly the address 100 becomes a new value 101. Then, the corrected data A is written in the address 101. The mapping of memory area in the EEPROM 2 is illustrated in FIG. 6. At the time when the address has changed from 100 to 101, the address 101 has not undergone rewriting of data so that the data A may be rewritable several hundred thousand times more in this address.

The procedure for execution of reading data will be explained hereunder with reference to the flow chart shown in FIG. 4. Here, an example in which data is read from the EEPROM 2 and shown on a display unit will be described.

FIG. 4 illustrates a flow chart explaining the procedure for execution of reading data. In order to read the data A, the address which stores the data A is read by making reference to the address 200 of the table in the EEPROM 2 and, then, the data A is read from the address 100 in the EEPROM (step 901). Then, it is checked whether an error correction has been made at the reading of the data A (step 903). If an error correction has been executed, the address stored in the address 200 of the table is added by +1. Then, the data A which has now been read out and corrected is written in the new address 101 which has been added by +1 to the previous address 100 (step 904). In the procedure shown in FIGS. 3 and 4, when any one of the bits is erroneous in one address, the use of its address is stopped. Probability that two or more bits fall in failure simultaneously in the same address is extremely rare and negligible. Therefore, even if the data read out is that which has been corrected, the data itself is correct and the data written in the address which has been added by +1 is active.

Assuming that an address value 100 for the data A is stored in the address 200 of the table and one bit in the address 100 happens to be an erroneous one, the procedure for execution of reading data is as follows.

By making reference to the address 200 of the table in the EEPROM 2, the address value 100 for the data A is read out. Then, the value of the data A is read out from the address 100 in the EEPROM 2. Because one bit of the address 100 is erroneous, an error correction signal S11 is outputted, so that the address value stored in the address 200 of the table is added by +1 and it becomes a new value 101 accordingly. Then, the data A now read out and corrected is written in the address 101. The value of the data A read out is transferred to a display unit and is shown (step 905).

When any one of the memory bits in the address 101 is erroneous, an address 102 is used in the same way as mentioned above. The auxiliary addresses 105–107 for the data B are used in the same way as those for the data A.

Now, a second embodiment according to the present invention will be explained with reference to the appended drawings.

FIG. 7 shows a block diagram of an information processing device as a second embodiment which executes the procedure illustrated in FIGS. 3 and 4 by means of a hardware. In this figure, there are shown an EEPROM 21 for data memory and an EEPROM 22 for table memory which stores addresses for the data stored in the EEPROM 21.

The operation at the time of reading and writing data A will be explained hereinafter on the premise that the EEPROM 21 for data memory and the EEPROM 22 for table memory have been mapped as shown in FIG. 5.

The procedure for execution of writing data is as follows.

In order to write the data A, the table address 200 which stores the address where the data A is stored is given to an address latch 23, a new value of data to be written is given to a data latch 26 and an instruction of writing data is set to a control circuit 27. The control circuit 27 clears a latch 28, makes a table reading signal S31 active, and makes a writing/reading signal S35 active as a writing signal. Upon the table reading signal S31 becoming active, the address 100 which stores the data A is outputted from the EEPROM 22 for table memory and is inputted to an address latch 24. Because the latch 28 has already been cleared, the address 100 inputted to the address latch 24 is not subjected to any addition and is given to the EEPROM 21 for data memory as an address for the data A. Thereafter, the control circuit 27 makes a data reading signal S36 active so that the data A is read out from the address 100 in the EEPROM 21 for data memory. Here, if an error correction has been executed, an error correction signal S30 for indicating the execution of an error correction is active so that the signal S30 sets the latch 28. If an error correction has not been conducted, the error correction signal S30 is not active and the latch 28 is not set. Then, the control circuit 27 makes a timing signal S34 for writing data active. The contents of the data latch 26 are given to the EEPROM 21 for data memory as the data A to be written therein, and the output of an adder 25 is given to the EEPROM 22 for table memory as the address data to be written therein.

The adder 25 in this stage operates differently depending on whether an error correction has been conducted on the data which was read out from the address 100 in the EEPROM 21 for data memory. In the case where an error correction was conducted on the data, as the latch 28 has already been set, the adder 25 outputs an address value which is added by +1 to the address value taken in the address latch 24. And, writing signals S32, S33 outputted from AND gates 40, 41, respectively, become active. The data taken in the data latch 28 is, therefore, written in the address 101 of the EEPROM 21 for data memory which address has been added by +1 to the address 100, and the new address 101 for the data A is written in the table address 200 of the EEPROM 22 for table memory. On the contrary, in the case where no error correction has been made on the data, the latch 28 has not been set, so that the adder 25 outputs the same address which has been taken in the address latch 24. The writing signal S33 outputted from the AND gate 41 becomes active because the writing/reading signal S35 inputted to an OR gate 42 is active, but the writing signal S32 outputted from the AND gate 40 does not become active. The data taken in the data latch 26 is, therefore, written in the address 100 of the EEPROM 21 for data memory. In the EEPROM 22 for table memory, no rewriting of the address where the data A is stored is done.

How the reading of the data A is executed is now explained. The explanation is made on an example wherein the data is read from an EEPROM and shown on a display unit.

In order to read out the data A, at first, the table address 200, which stores the address where the data A is memorized, is given to the address latch 23 and the reading instruction is given to the control circuit 27. Then, the control circuit 27 clears the latch 28 and makes the table reading signal S31 active. The control circuit 27 also makes the writing/reading signal S35 active for the reading state. Upon the table reading signal S31 becoming active, the address 100 where the data is stored is outputted from the EEPROM 22 for table memory and is taken in the address latch 24. Because the latch 28 has been cleared, the address 100 stored in the address latch 24 is given to the EEPROM 21 for data memory as the address of data A without any addition. Next, the control circuit 27 makes the data reading signal S36 active, so that the data is read out from the address 100 of the EEPROM 21 for data memory and is taken in the data latch 26. Here, if an error correction has been executed, the error correction signal S30 is active so that the latch 28 is set. If an error correction has not been conducted, the error correction signal S30 for executing error correction is not active so that the latch is not set. Thereafter, the control circuit 27 makes the timing signal S34 for writing data active. The contents of the data latch 26 are given to the EEPROM 21 for data memory as the data A to be written, and the output of the adder 25 is given to the EEPROM 22 for table memory as an address data to be written therein.

The operation of the adder 25 in this stage differs depending on whether an error correction has been made on the data which was read from the address 100 in the EEPROM 21 for data memory. Where an error correction has been made on the data, the latch 28 has been set so that the adder 25 outputs the value which is added by +1 to the address value taken in the address latch 24. And, the writing signals S32, S33 outputted from the AND gates 40, 41 respectively, become active. The data taken in the data latch 26 is, therefore, written in the address 101 of the EEPROM 21 for data memory which address has been added by +1 to the address 100, and the new address 101 for the data A is written in the address table 200 of the EEPROM 22 for table memory. The data taken in the data latch 26 is correct since it has been corrected.

Where no error correction was made on the data, the latch 28 has not been set so that the writing signals S32 and S33 outputted from the AND gates 40, 41 respectively, do not become active. In the EEPROM 22 for table memory, therefore, no rewriting of the address where the data A is stored is effected, and the rewriting of data in the EEPROM 21 for data memory is not effected either.

The value of the data A thus read out is transferred to the display unit.

In the second embodiment of the present invention, as in the first embodiment, an address 102 is used in the same way as explained above when any one of memory bits in the address 101 is erroneous. The auxiliary addresses 105–107 for the data B are used in the same way as those for the data A.

As explained above, the information processing device according to the present invention comprises the logical circuit which outputs the signal for indicating the execution of an error correction when the error check and correction circuit has detected and corrected the error of data at the time of reading data. Therefore, according to the present invention, while the EEPROM outputs the correct data by means of the ECC circuit, it can be known whether there has existed an error in a part of the cells in the EEPROM so that it is possible to alter the address used in the EEPROM or to change the EEPROM itself before malfunction occurs in the information processing device having the EEPROM due to a breakdown of the EEPROM cells.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An information processing device comprising:
   an array of EEPROM cells;
   an error check and correction circuit coupled to said array of EEPROM cells for checking for an error in bits forming a data read out from said array of EEPROM cells and for executing an error correction on said error in said bits so that a corrected data is outputted from said error check and correction circuit;
   a logical circuit coupled to said array of EEPROM cells for outputting an error correction signal for indicating an execution of said error correction when said error check and correction circuit detects and corrects said error in said bits; and
   address altering means coupled to said array of EEPROM cells for altering a current address where said data is stored in said array of EEPROM cells on the basis of said error correction signal outputted from said logical circuit, said corrected data corrected by said error check and correction circuit is stored in said array of EEPROM cells at a new address which is that address which is altered from said current address by said address altering means.

2. An information processing device according to claim 1, wherein said address altering means includes:
   a latch which is set on the basis of said error correction signal for indicating the execution of the error correction; and
   an adder responsive to said latch being set for adding a predetermined value to a value of said current address in order to output said new address where said corrected data which is corrected by said error check and correction circuit is stored.

3. An information processing device comprising:
   a first EEPROM cell array for providing a data memory for storing data therein, said first EEPROM cell array having an error check and correction circuit;
   a second EEPROM cell array for providing a memory table for storing a table of addresses for said data stored in said first EEPROM cell array;
   a control circuit coupled to said first and second EEPROM cell arrays, said control circuit producing a table reading signal and a timing signal which is output to said second EEPROM cell array, and said control circuit producing and outputting said timing signal, a data reading signal, and a reading/writing control signal which is output to said first EEPROM cell array;
   a first address latch coupled to said second EEPROM cell array for supplying a table address to said second EEPROM cell array;
   a second address latch coupled to said second EEPROM cell array for receiving a current address while said data is stored in said first EEPROM cell array;
   an error correction latch coupled to said error check and correction circuit in said first EEPROM cell array, said error correction latch is initially cleared by said control circuit and is set by an error correction signal for indicating an execution of an error correction from said error check and correction circuit;
   an adder coupled to said second address latch and said first EEPROM cell array for producing as an address signal to said first EEPROM cell array, said current address being outputted from said second EEPROM cell array while said error correction latch is cleared and a new address different from said current address while said error correction latch is set; and
   a data latch coupled to said first EEPROM cell array for latching said data which is read out from said first EEPROM cell array in response to said data reading signal and said reading/writing control signal from said control circuit, said data read out from said first EEPROM cell array is written at said new address of said first EEPROM cell array if said data has been error corrected by said error check and correction circuit, and said new address issued from said adder for indicating where said error corrected data is stored in said first EEPROM cell array being written in said second EEPROM cell array in response to said timing signal from said control circuit.

* * * * *